US008800991B2

(12) United States Patent
Timperley

(10) Patent No.: US 8,800,991 B2
(45) Date of Patent: *Aug. 12, 2014

(54) GAMING CONSOLE WITH TRANSPARENT SPRITES

(71) Applicant: Aristocrat Technologies Australia Pty Limited, North Ryde (AU)

(72) Inventor: David Timperley, Randwick (AU)

(73) Assignee: Aristocrat Leisure Industries Party Ltd. (AU)

( * ) Notice: Subject to any disclaimer, the term of this patent is extended or adjusted under 35 U.S.C. 154(b) by 0 days.

This patent is subject to a terminal disclaimer.

(21) Appl. No.: 13/875,646

(22) Filed: May 2, 2013

(65) Prior Publication Data
US 2013/0244779 A1 Sep. 19, 2013

Related U.S. Application Data

(63) Continuation of application No. 12/868,211, filed on Aug. 25, 2010, now Pat. No. 8,480,478, which is a continuation of application No. 12/539,955, filed on Aug. 12, 2009, now Pat. No. 7,901,284, which is a continuation of application No. 11/542,296, filed on Oct. 2, 2006, now Pat. No. 7,628,694, which is a continuation of application No. 09/369,804, filed on Aug. 6, 1999, now Pat. No. 7,115,033.

(30) Foreign Application Priority Data

Aug. 10, 1998 (AU) .......................................... PP5184

(51) Int. Cl.
A63F 13/00 (2014.01)
G07F 17/34 (2006.01)

(52) U.S. Cl.
USPC ........ 273/143 R; 273/138.2; 463/20; 463/16; 463/31; 463/32; 463/34

(58) Field of Classification Search
USPC ............... 273/143 R, 138.2, 138.1, 292, 274; 463/20, 19, 16, 12, 13, 46, 31, 32, 34
See application file for complete search history.

(56) References Cited

U.S. PATENT DOCUMENTS

| 5,395,111 | A | * | 3/1995 | Inoue | 273/143 R |
| 5,472,195 | A | * | 12/1995 | Takemoto et al. | 463/31 |
| 5,935,002 | A | * | 8/1999 | Falciglia | 463/19 |
| 5,980,384 | A | * | 11/1999 | Barrie | 463/16 |
| 6,086,066 | A | * | 7/2000 | Takeuchi et al. | 273/143 R |
| 6,089,977 | A | * | 7/2000 | Bennett | 463/20 |
| 7,115,033 | B1 | * | 10/2006 | Timperley | 463/20 |
| 2002/0077172 | A1 | * | 6/2002 | Uchiyama et al. | 463/20 |

* cited by examiner

Primary Examiner — Benjamin Layno
(74) Attorney, Agent, or Firm — McAndrews, Held & Malloy, Ltd.

(57) ABSTRACT

The present invention provides a gaming console 40 having display means 41, and game control means 100 arranged to control images displayed on the display means 41. The game control means 100 are arranged to play a game wherein a plurality of symbols 43 are randomly selected and displayed on the display means 41 and, if a winning combination results, the console 40 pays a prize. The console 40 is characterized in that the displayed images include a first image component 31 which displays basic game features and a second image component 50 which displays image features which appear superimposed on the first image component 31. The second image component 50 is transparent, whereby the first image component 31 is visible through the second image component 50 under the control of the control means 100.

6 Claims, 3 Drawing Sheets

GAMING CONSOLE WITH TRANSPARENT SPRITES

RELATED APPLICATIONS

This application is a continuation of U.S. patent application Ser. No. 12/868,211, having a filing date of Aug. 25, 2010, which claims priority to, and is a continuation of, U.S. application Ser. No. 12/539,955, having a filing date of Aug. 12, 2009, now U.S. Pat. No. 7,901,284 issued on Mar. 8, 2011; which claims priority to, and is a continuation of, U.S. patent application Ser. No. 11/542,296, having a filing date of Oct. 2, 2006, now U.S. Pat. No. 7,628,694, issued on Dec. 8, 2009; which claim priority to, and is a continuation of, U.S. patent application Ser. No. 09/369,804, having a filing date of Aug. 6, 1999, now U.S. Pat. No. 7,115,033, issued on Oct. 3, 2006; which claims priority to Australian Patent Application No. PP5184, having a filing date of Aug. 10, 1998, all of which are incorporated herein by reference in their entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention relates to gaming machines of the type generally referred to as slot machines, fruit machines or poker machines, and in particular the invention provides an improvement to a game played on such a machine.

Players who regularly play gaming machines quickly tire of particular games and therefore it is necessary for manufacturers of these machines to come up with innovative game features that add interest to the games provided on such machines in order to keep the players amused and therefore willing to continue playing the game.

Gaming or poker machines have been well known for many years and have more recently gained considerable popularity, with quite substantial amounts of money wagered on these machines. There is a growing tendency for Governments to legalise the use of gaming machines by licensing operators, with resulting revenue gains through license fees and taxation of monies invested. The licensed operation of gaming machines is the subject of legislation and regulation. This regulation almost always dictates a minimum percentage payout for a gaming machine. For example, a minimum of 85% of monies invested must be returned as winnings, and manufacturers of gaming machines therefore must design their machines around these regulatory controls.

With the growth that has occurred in the gaming machine market there is intense competition between manufacturers to supply the various existing and new venues. When selecting a supplier of gaming machines, the operator of a venue will often pay close attention to the popularity of various games with their patrons. Therefore, gaming machine manufacturers are keen to devise games which are popular with players, as a mechanism for improving sales.

Many various strategies have been tried in the past to make games more enticing to players, including the commonly known double-up feature, whereby, if a player wins a particular game, they can then risk the winnings of that game in a double-or-nothing mode in which they gamble on a subsequent, and often different, game such as whether a red or black card will be the next card drawn.

Other techniques adopted in the past have been to provide complexity in the numbering and combinations of indicia which would result in a win, thereby hoping to convince the player that there is a greater chance of winning and to keep their interest in a particular game.

Many gaming control authorities do not permit images to be superimposed over a game image if they obliterate a part of the game image that would be used to display the outcome of a game. In the past, game designers were therefore forced to squeeze auxiliary images into small spaces on the periphery of the screen or to make the game area of the screen proportionally smaller, however neither of these are desirable options as they reduce the attractiveness of the game for the player. On the one hand if feature indicators are small they might not be seen by the player and the player might not take advantage of a feature currently on offer by the console. On the other hand if the main game image is too small it will not be attractive to players.

BRIEF SUMMARY OF THE INVENTION

According to a first aspect, the present invention provides a gaming console having an electronic display means, and game control means arranged to control images displayed on the electronic display means, the game control means being arranged to play a game wherein a plurality of symbols are randomly selected and displayed on the electronic display means and, if a winning combination results, the console pays a prize, the game being characterised in that the displayed images include a first image component which displays basic game features and a second image component which displays non-basic image features which appear superimposed on the first image component and are additional to the basic game features, the second image component being transparent, whereby the first image component is visible through the second image component under the control of the control means such that the second image component does not conceal the first image component, and wherein the first image component and the second image component are displayed on the same electronic display.

In accordance with one or more of the above aspects of the invention, the second image component can take various forms such as an animated or fixed character, a window or a graphic and may be used to indicate a feature game or special prize, or a message to the player about an available option or feature, a condition or mode of the console, or a service message broadcast by the establishment in which the console is installed. Examples of second image components include sprites which appear during games and move about the screen to indicate special or bonus symbols, function indicators such as "reserved" indicators and message text or boxes containing message text broadcasting service messages such as operating hours, coming attractions (theatre performances etc.) or bonus prize periods.

The second image may be variably transparent, and may be varied in transparency from "solid" where the underlying first image is totally obliterated, to a faint ghost like image where the underlying image is clearly visible through the second image.

The second image may be static in the case of a "reserved" lock or service message, or may move about the screen as in the case of a sprite indicating bonus symbols in a spinning reel game. The image may also be animated such that the sprite may change shape or attitude, for example walk or run about the screen with moving arms pointing at feature symbols.

Other animated effects may be used, for example in a game with a vampire or ghoulish theme, the "reserved" sign may drip blood, with an image of a growing puddle of blood at the bottom of the screen.

In cases where the second image takes the form of an animated character, it may further be animated such that it "reacts" to certain conditions. For example, in a game with a ghoulish theme, the second image may appear to be frightened when it is situated next to a certain game symbol, for example a ghoul. In other cases, when the second image is acting as a wild card symbol, it may appear to be happy and excited when it causes winning combinations to occur.

The present invention is applicable to video gaming consoles of the traditional poker machine style (also known as slot machines or fruit machines) in which the display means comprises a video simulation of a set of rotatable reels, each carrying a plurality of symbols. The invention is equally applicable to video draw poker consoles in which a poker hand is displayed on a screen, the cards of the hand being selected from a standard 52 or 53 card deck.

The occurrence of the second image may be triggered by the occurrence of a special symbol or a predetermined combination of special symbols displayed in a particular arrangement.

In cases where the second image takes the form of an animated character and acts as a wild card symbol, the second image may be moved from one location to another via an animated walking motion.

BRIEF DESCRIPTION OF SEVERAL VIEWS OF THE DRAWINGS

An embodiment of the invention will now be described, by way of example with reference to the accompanying drawings, in which.

DETAILED DESCRIPTION OF THE INVENTION

In the following detailed description the methodology of the embodiments will be described, and it is to be understood that it is within the capabilities of the non-inventive worker in the art to introduce the methodology on any standard microprocessor-based gaming console by means of appropriate programming.

Figure 1:
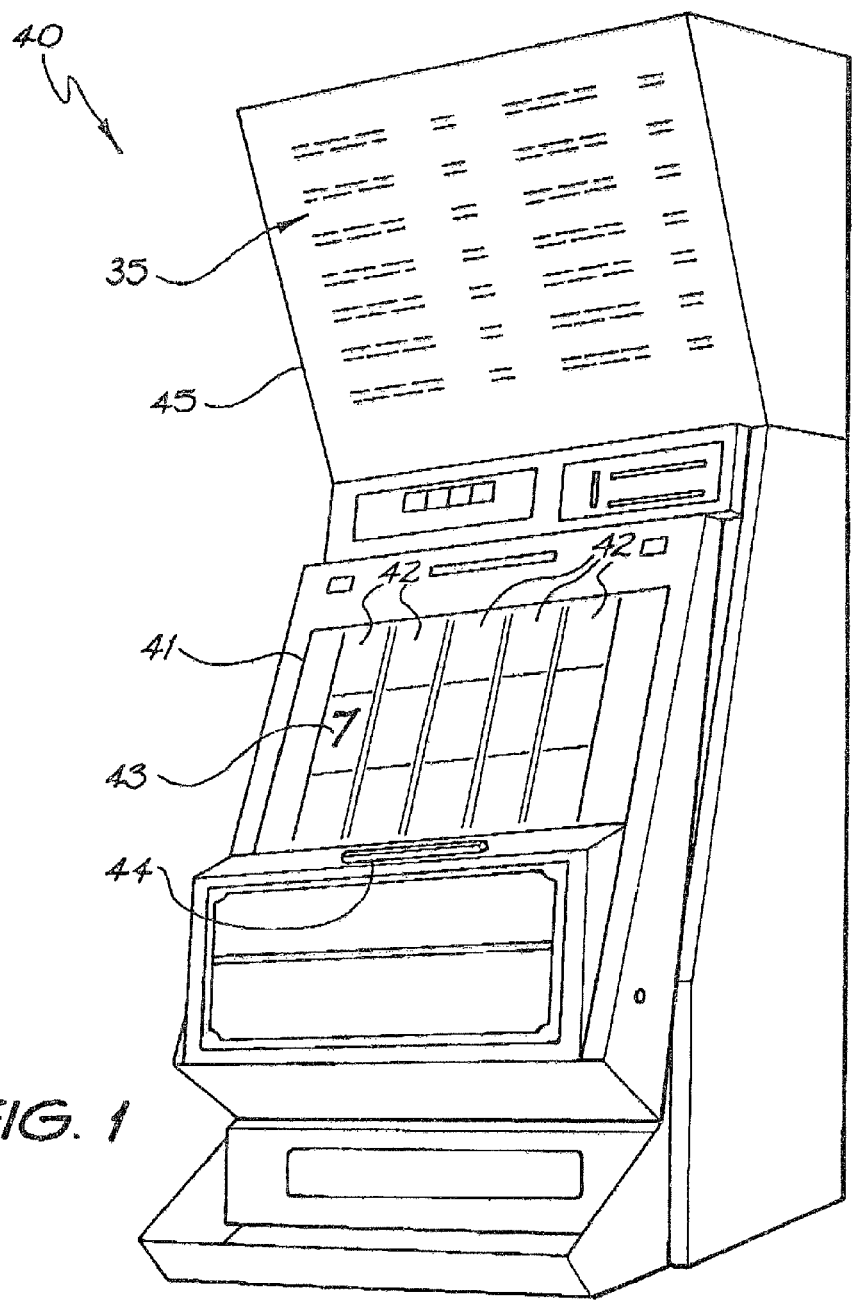
FIG. 1 illustrates a gaming console with a video simulation of a rotating reel display incorporating a first embodiment of the invention.

Referring to FIG. 1 of the drawings, the first embodiment of the invention is illustrated in which a gaming console 40, of the type having a video display screen 41 which displays a plurality of rotatable reels 42 carrying symbols 43, is arranged to pay a prize on the occurrence of a predetermined symbol or combination of symbols.

In the gaming console 40 illustrated in FIG. 1, the game is initiated by a push button 44, however, it will be recognised by persons skilled in the art that this operating mechanism might be replaced by a pull handle or other type of actuator in other embodiments of the invention. The top box 45 on top of the gaming console 40 carries the artwork panel 35 which displays the various winning combinations for which a prize is paid on this console.

Figure 2:
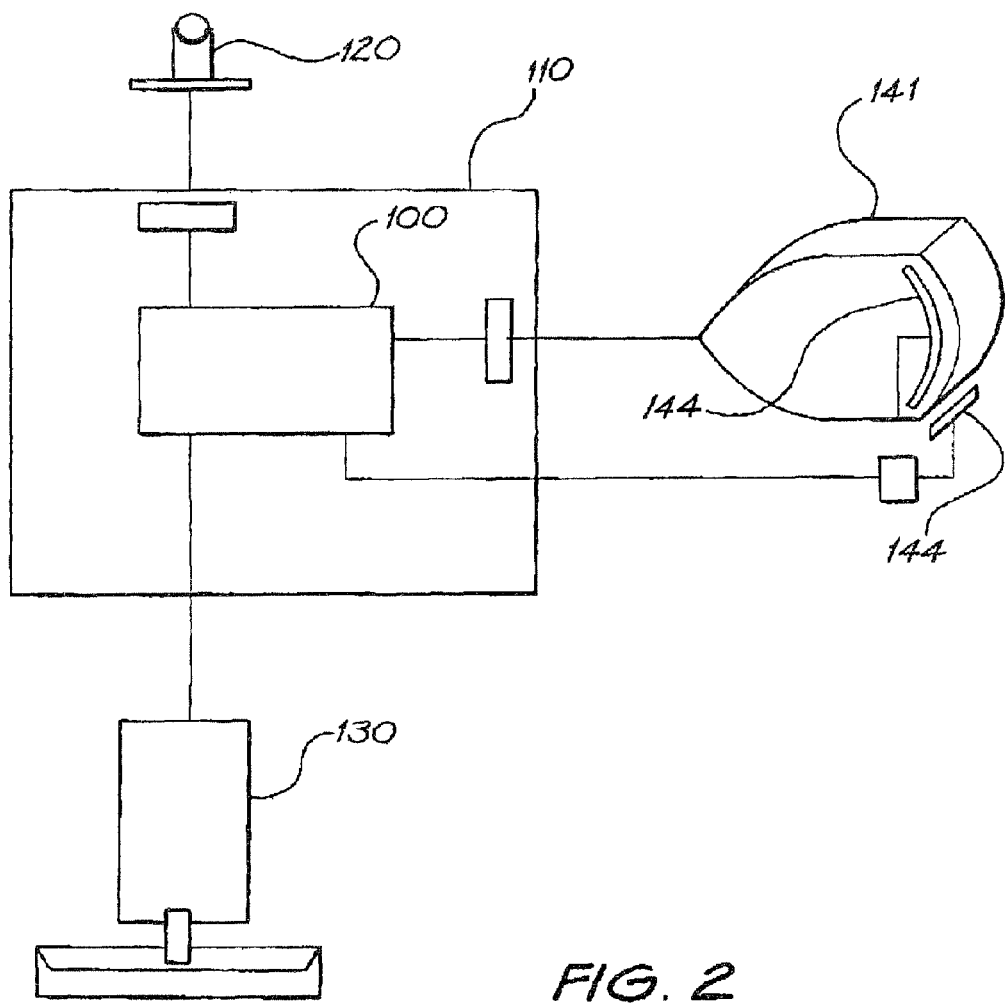
FIG. 2 is a schematic diagram of a gaming console control circuit.

The program which implements the game and game feature is run on a standard gaming console control processor 100 as illustrated schematically in FIG. 2. This processor forms part of a controller 110 which drives the video display screen 141 and receives input signals from sensors 144. The sensors 144 may be touch sensors, a pull handle or another type of actuator in other embodiments of the invention. The controller 110 also receives input signals from a mechanism 120 indicating the user has provided sufficient credit to begin playing. The mechanism 120 may be a coin input chute, a credit card reader, or other type of validation device. The controller 120 further drives a payout mechanism 130 which for example may be a coin output.

The game played on the console shown in FIGS. 1 and 2 is a relatively standard game which includes a 3 by 5 symbol display and allows multiple pay lines. The game also includes a special feature embodying the invention, the special feature being that the displayed images include a first image component which displays basic game features and a second image component which displays image features which appear superimposed on the first image component, the second image component being transparent, whereby the first image component is visible through the second image component under the control of the control means.

Figure 3:
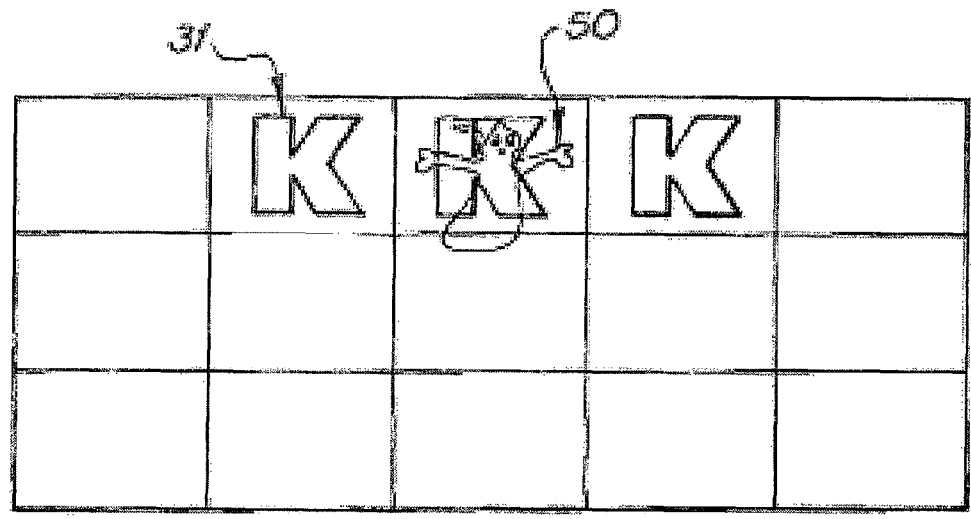
FIG. 3 illustrates an embodiment of the invention in which the transparent second image is displayed on the display means and superimposed on elements of the first image.

FIG. 3 shows an embodiment of the invention in which the transparent second image component 50 appears superimposed over elements 31 of the first image. The second image component 50 does not prevent the user from determining the type of the symbol(s) "underneath" it. In this case the second image component 50 appears as an animated ghostlike character, and may be animated by its arms waving to the user or pointing at particular features on the screen, or it may be animated as it moves about the screen. Furthermore, the transparency of the ghostlike character 50 may vary. For example, if the character 50 moves about the screen to a position where it is located close to a certain image, for example a ghoul, the character 50 may be animated to appear shocked or scared, and to further become pale and highly transparent in response, possibly to the point of only just being visible to the user as a faint ghostly image. On the other hand, if for example the second image 50 moves to a position where it creates a winning combination, it may be animated to appear to be happy that the user has won, and it may become less transparent, and more solid and visible to the user. The transparency of the second image 50 may also be continuously varying, such that the image 50 will appear to flash or pulse, which will attract the user's eye to the current feature of interest.

Figure 4:
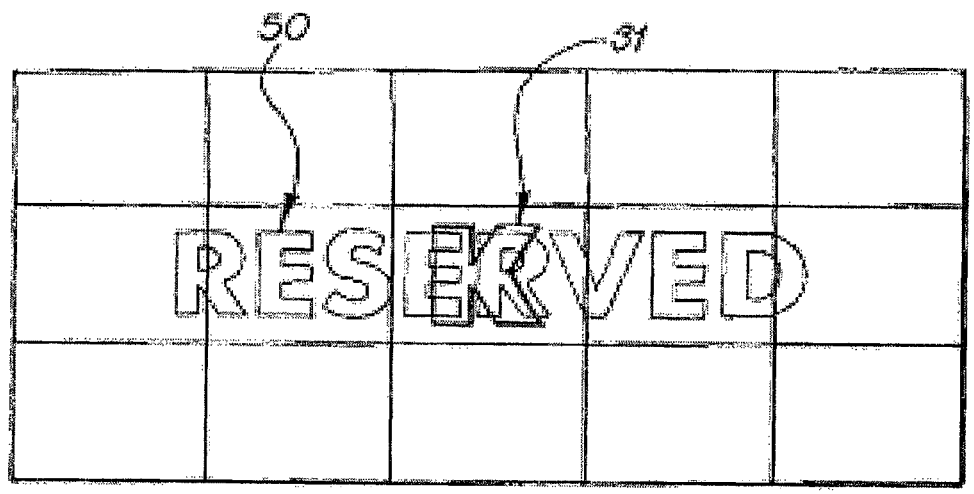
FIG. 4 illustrates an embodiment of the invention in which the second image component functions as a message to the player.

FIG. 4 shows an embodiment in which the second image component 50 has been displayed in response to a mode of the console, in this case the console has been reserved. As the second image component 50 is transparent it serves both the function of informing potential users that the console is unavailable to them, while still allowing potential users to see the features and symbols 31 of the game "through" the reserved sign, thereby attracting potential users for the future. Although the second image component is static in FIG. 4, it may alternatively be animated in various ways. For example, in a game with a vampire theme, the "reserved" sign may be animated in such a way that it appears to slowly drip blood, and an image of a pool of blood may gradually grow or collect at the bottom of the screen.

Although the invention has been described with reference to particular examples of the invention, it should be appreciated that it may be exemplified in other forms. For instance, the second image component can take various forms such as a fixed character, a window or a graphic and may be used to indicate a feature game or special prize, or a message to the player about an available option or feature, a condition or mode of the console, or a service message broadcast by the establishment in which the console is installed.

The present invention is applicable to video gaming consoles of the traditional poker machine style (also known as slot machines or fruit machines) in which the display means comprises a video simulation of a set of rotatable reels, each carrying a plurality of symbols. The invention is equally applicable to video draw poker consoles in which a poker hand is displayed on a screen, the cards of the hand being selected from a standard 52 or 53 card deck.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A gaming machine for playing a game having a symbol set, the gaming machine comprising:
   an electronic display having a plurality of display positions, and configured to display a plurality of symbols from said symbol set; and
   a game controller configured to 1) select a plurality of symbols from said symbol set for display at said display positions, 2) generate a secondary image having a degree of transparency, 3) superimpose said secondary image on at least one of said selected symbols while allowing said at least one of said selected symbols to be visible through said superimposed secondary image, and 4) vary said degree of transparency of said secondary image dependent on a display position of said at least one of said selected symbol relative to said electronic display.

2. The gaming machine as claimed in claim 1, wherein the secondary image comprises an animated character being moveable about the electronic display.

3. The gaming machine as claimed in claim 2, wherein the animated character points to a feature displayed on the electronic display.

4. A method for use by a gaming machine 1) for playing a game having a symbol set, and 2) comprising an electronic display having a plurality of display positions, and a game controller, the method comprising:
   selecting during said game via said game controller a plurality of symbols from said symbol set for display at said display positions;
   generating via said game controller a secondary image having a degree of transparency;
   superimposing on said display said secondary image on at least one of said selected symbols while allowing said at least one of said selected symbols to be visible through said superimposed secondary image; and
   varying via said game controller said degree of transparency of said secondary image dependent on a display position of said at least one of said selected symbol relative to said electronic display.

5. The method as claimed in claim 4, wherein the secondary image comprises an animated character being moveable about the electronic display.

6. The method as claimed in claim 5, wherein the animated character points to a feature displayed on the electronic display.

\* \* \* \* \*